(12) United States Patent
Lopez et al.

(10) Patent No.: US 11,773,721 B2
(45) Date of Patent: Oct. 3, 2023

(54) TURBINE DIAGNOSTICS

(71) Applicant: ABB Schweiz Ag, Baden (CH)

(72) Inventors: Camilo Lopez, Export, PA (US); Mark Foltz, Pittsburgh, PA (US); Steve Miller, Pittsburgh, PA (US); Kevin Dowdell, Pittsburgh, PA (US); Mark Wieland, Cranberry, PA (US); Alan Majors, Pittsburgh, PA (US)

(73) Assignee: ABB Schweiz AG, Baden (CH)

( * ) Notice: Subject to any disclaimer, the term of this patent is extended or adjusted under 35 U.S.C. 154(b) by 491 days.

(21) Appl. No.: 17/092,447

(22) Filed: Nov. 9, 2020

(65) Prior Publication Data

US 2021/0054741 A1 Feb. 25, 2021

Related U.S. Application Data

(63) Continuation of application No. PCT/US2019/031449, filed on May 9, 2019.
(Continued)

(51) Int. Cl.
*F01C 20/28* (2006.01)
*G01P 21/02* (2006.01)
(Continued)

(52) U.S. Cl.
CPC .............. *F01C 20/28* (2013.01); *F01D 17/06* (2013.01); *F01D 21/02* (2013.01); *F01K 13/003* (2013.01);
(Continued)

(58) Field of Classification Search
CPC ................. F02D 41/0007; F02D 23/00; F02D 2200/101; F02C 9/00; F02C 9/28
See application file for complete search history.

(56) References Cited

U.S. PATENT DOCUMENTS 2,827,020 A   3/1958   Cook
3,597,653 A   8/1971   Moore et al.
(Continued)

FOREIGN PATENT DOCUMENTS

CN   1678913 A   10/2005
EP   1191190 A1   3/2002
(Continued)

OTHER PUBLICATIONS

Search Report and Written Opinion, PCT Appln. No. PCT/US19/31449, 6 pgs, dated Jul. 25, 2019.
(Continued)

*Primary Examiner* — Jermele M Hollington
*Assistant Examiner* — Temilade S Rhodes-Vivour
(74) *Attorney, Agent, or Firm* — Leydig, Voit & Mayer, Ltd.

(57) ABSTRACT

A turbine speed probe diagnostic system is provided. The turbine includes a speed probe and a speed reading circuit. A speed lead connects the speed probe and speed reading circuit together to transmit speed signals from the speed probe to the speed reading circuit. A speed probe diagnostic circuit is also provided for connection to the speed lead. An isolation switch is provided to isolate the speed probe diagnostic circuit during normal operation when the speed reading circuit is receiving speed signals from the speed probe. When no speed signals are being received, the isolation switch closes and the speed probe diagnostic circuit performs a test on the speed probe or speed lead.

20 Claims, 11 Drawing Sheets

Related U.S. Application Data

(60) Provisional application No. 62/669,057, filed on May 9, 2018, provisional application No. 62/669,070, filed on May 9, 2018, provisional application No. 62/669,048, filed on May 9, 2018, provisional application No. 62/669,042, filed on May 9, 2018, provisional application No. 62/669,063, filed on May 9, 2018.

(51) Int. Cl.
| | |
|---|---|
| G01R 31/28 | (2006.01) |
| F01D 17/06 | (2006.01) |
| F02C 9/28 | (2006.01) |
| F01D 21/02 | (2006.01) |
| H02J 3/38 | (2006.01) |
| H02J 3/40 | (2006.01) |
| F01K 13/00 | (2006.01) |
| F01K 13/02 | (2006.01) |
| F16K 37/00 | (2006.01) |

(52) U.S. Cl.
CPC ........... *F01K 13/02* (2013.01); *F02C 9/28* (2013.01); *F16K 37/0041* (2013.01); *F16K 37/0083* (2013.01); *G01P 21/02* (2013.01); *G01R 31/2829* (2013.01); *H02J 3/381* (2013.01); *H02J 3/40* (2013.01); *F05D 2220/31* (2013.01); *F05D 2260/80* (2013.01); *F05D 2270/02* (2013.01); *F05D 2270/021* (2013.01); *F05D 2270/80* (2013.01)

(56) References Cited

U.S. PATENT DOCUMENTS

| | | |
|---|---|---|
| 4,020,685 A | 5/1977 | Van Millingen et al. |
| 4,099,237 A | 7/1978 | Zitelli et al. |
| 4,183,242 A | 1/1980 | Brown |
| 4,254,344 A * | 3/1981 | Fancy ............... G01P 3/48 307/64 |
| 4,345,191 A | 8/1982 | Takats et al. |
| 4,356,447 A | 10/1982 | Hönig et al. |
| 4,434,470 A | 2/1984 | Thomas et al. |
| 4,485,452 A | 11/1984 | Cording et al. |
| 4,494,207 A | 1/1985 | Chang et al. |
| 4,506,339 A | 3/1985 | Kühnlein |
| 4,554,788 A | 11/1985 | Hwang et al. |
| 4,602,515 A | 7/1986 | Eichenlaub |
| 4,635,209 A | 1/1987 | Hwang et al. |
| 4,712,372 A * | 12/1987 | Dickey .............. F01D 21/02 324/160 |
| 4,715,009 A | 12/1987 | Böhmler et al. |
| 4,746,862 A | 5/1988 | Ueki |
| 4,774,845 A | 10/1988 | Barbe et al. |
| 4,788,647 A | 11/1988 | McManus et al. |
| 4,873,512 A * | 10/1989 | Miller ............... G01R 19/165 340/649 |
| 4,887,214 A | 12/1989 | Takats et al. |
| 4,955,269 A | 9/1990 | Kendig et al. |
| 4,972,332 A | 11/1990 | Luebbering et al. |
| 4,975,845 A | 12/1990 | Mehta |
| 5,165,271 A | 11/1992 | Stepper et al. |
| 5,371,460 A | 12/1994 | Coffman et al. |
| 5,508,609 A | 4/1996 | Parkinson et al. |
| 5,537,322 A | 7/1996 | Denz et al. |
| 5,559,705 A | 9/1996 | McClish et al. |
| 5,789,658 A | 8/1998 | Henn et al. |
| 5,933,005 A | 8/1999 | Pugh |
| 6,131,547 A | 10/2000 | Weber et al. |
| 6,292,717 B1 | 9/2001 | Alexander et al. |
| 6,445,995 B1 | 9/2002 | Mollmann |
| 6,727,686 B2 | 4/2004 | Beckmann et al. |
| 6,804,600 B1 | 10/2004 | Uluyol et al. |
| 8,100,000 B1 | 1/2012 | Rankin |
| 8,174,268 B2 | 5/2012 | Bose et al. |
| 8,222,760 B2 | 7/2012 | Menke |
| 8,352,149 B2 | 1/2013 | Meacham |
| 8,428,784 B2 | 4/2013 | Krueger |
| 8,464,598 B2 | 6/2013 | Cazaux et al. |
| 8,753,067 B2 | 6/2014 | Shindo |
| 9,140,718 B2 | 9/2015 | O'Neil et al. |
| 9,438,026 B2 | 9/2016 | Franks et al. |
| 9,708,926 B2 | 7/2017 | Curlier et al. |
| 10,371,072 B2 | 8/2019 | Gouzenne Coutier |
| 10,392,962 B2 | 8/2019 | Rowe et al. |
| 10,487,683 B2 | 11/2019 | Gerez et al. |
| 10,989,063 B2 | 4/2021 | Xiong et al. |
| 2003/0007861 A1 | 1/2003 | Brooks et al. |
| 2004/0050178 A1 | 3/2004 | Parkinson |
| 2008/0110283 A1 | 5/2008 | Shaver et al. |
| 2010/0088003 A1 | 4/2010 | Meacham |
| 2010/0324799 A1 | 12/2010 | Davison |
| 2013/0098042 A1 | 4/2013 | Frealle et al. |
| 2013/0289933 A1 | 10/2013 | Hess et al. |
| 2014/0070794 A1 | 3/2014 | Cosby et al. |
| 2014/0241850 A1 | 8/2014 | Duge |
| 2014/0260249 A1 | 9/2014 | Shapiro et al. |
| 2015/0096371 A1 | 4/2015 | O'Neil et al. |
| 2015/0211380 A1 | 7/2015 | Curlier et al. |
| 2016/0090918 A1 | 3/2016 | Certain |
| 2016/0291052 A1 | 10/2016 | Riolo et al. |
| 2017/0343575 A1 | 11/2017 | Brown et al. |
| 2017/0356300 A1 | 12/2017 | Domnick et al. |
| 2018/0003073 A1 | 1/2018 | Rowe et al. |
| 2018/0031594 A1 | 2/2018 | Joseph et al. |
| 2018/0050789 A1 | 2/2018 | Marone et al. |
| 2018/0050816 A1 | 2/2018 | Yakobov et al. |

FOREIGN PATENT DOCUMENTS

| | | |
|---|---|---|
| EP | 2273649 A1 | 1/2011 |
| EP | 3757355 A1 | 12/2020 |
| JP | 49-41706 A | 4/1974 |
| JP | 52-170233 U | 12/1977 |
| JP | 53-125502 A | 11/1978 |
| JP | 58-202308 A | 11/1983 |
| JP | 60-156909 A | 8/1985 |
| JP | 61-55303 A | 3/1986 |
| JP | 61-269615 A | 11/1986 |
| JP | 61-276036 A | 12/1986 |
| JP | 61-286504 A | 12/1986 |
| JP | 62-225704 A | 10/1987 |
| JP | 8-227317 A | 9/1996 |
| JP | 2000-249629 A | 9/2000 |
| JP | 2003-148108 A | 5/2003 |
| JP | 2003-336503 A | 11/2003 |
| JP | 2004-159496 A | 6/2004 |
| JP | 2007-224918 A | 9/2007 |
| JP | 2007-302090 A | 11/2007 |
| JP | 2008-157663 A | 7/2008 |
| JP | 2012-90422 A | 5/2012 |
| WO | WO 2012/064592 A2 | 5/2012 |
| WO | WO 2014/147832 A1 | 9/2014 |

OTHER PUBLICATIONS

European Patent Office, Extended European Search Report in European Patent Application No. 19798932.0, 7 pp. (dated Mar. 7, 2022).

Japan Patent Office, Office Action in Japanese Patent Application No. 2020-563461, 5 pp. (dated Feb. 7, 2022).

\* cited by examiner

Early Value Actuation

Enabled ☑

Mechanical Load (Pressure) Input: AI1
Electrical Load (Current) Input: AI2

Protection SP: 70 %
Max Rate: 35 msec
Pulse Time: 1 sec

Output: DO1 ☐ DO2 ☐ DO3 ☐ DO4 ☐ DO5 ☑ DO6 ☐ DO7 ☐ DO8 ☐

FIG. 9

Trip Anticipator

Enabled ☑

Electrical Load (Megawatts) Input: AI2

Zero Load: 120 %
Rated Load: 105.5 %

Output: DO1 ☐ DO2 ☐ DO3 ☐ DO4 ☐ DO5 ☐ DO6 ☑ DO7 ☐ DO8 ☐

FIG. 10

Load Drop Anticipation

Enabled ☑

Mechanical Load (Pressure) Input: AI1
Generator Breaker Open Input: DI4

Min Load: 30
Pulse Time: 5

Output: DO1 ☐ DO2 ☐ DO3 ☐ DO4 ☐ DO5 ☐ DO6 ☐ DO7 ☑ DO8 ☐

FIG. 11

TURBINE DIAGNOSTICS

BACKGROUND

The present inventions relate generally to turbines, and more particularly, to detecting conditions of the turbine.

Electrical power plants employ large steam turbines to generate electricity. In a steam turbine, detecting various conditions of the turbine is important for efficient and safe operation of the steam turbine. The inventions disclosed herein provide new and improved methods for detecting conditions of a turbine.

BRIEF DESCRIPTION OF SEVERAL VIEWS OF THE DRAWINGS

The invention may be more fully understood by reading the following description in conjunction with the drawings, in which:

FIG. 5 is an illustration of a configuration window for overspeed protection.

FIG. 6 is an illustration of a configuration window for acceleration protection.

FIG. 7 is an illustration of a configuration window for rate-sensitive power load unbalance protection.

FIG. 8 is an illustration of a configuration window for close intercept valve protection.

FIG. 9 is an illustration of a configuration window for early valve actuation.

FIG. 10 is an illustration of a configuration window for trip anticipator.

FIG. 11 is an illustration of a configuration window for load drop anticipation.

DETAILED DESCRIPTION

In turbine control it is necessary for safety reasons to know if the turbine is spinning. It is important to know if the turbine is truly at rest or if the speed probe is missing. One aspect of the preferred embodiments relies upon the electrical characteristics of the speed probes and their proper installation to determine if the speed probe is properly connected.

Figure 1:
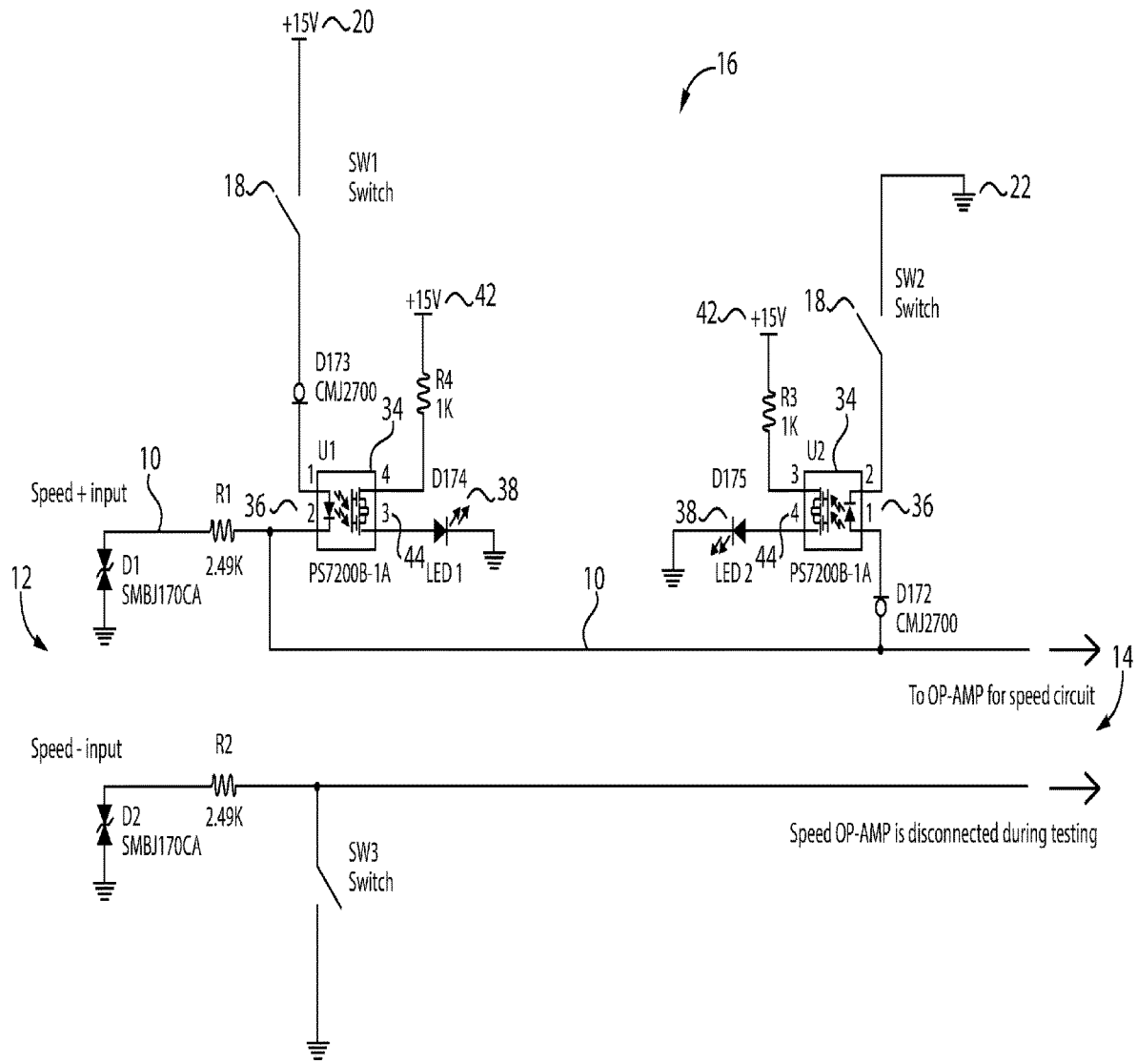
FIG. 1 is a schematic of one embodiment of a speed probe diagnostic circuit.

One embodiment of a speed probe detection (or diagnostic) circuit is shown in FIG. 1. In a first case, a no probe attached condition may be identified. Notice that when no probes are attached, the only way to get the LEDs to come on is to activate switches 1 & 2. All other cases will result in the LEDs being in the off state. In all the other cases, there is at least one other combination that would light at least one LED. The module will cycle through all eight combinations, the two ON state combinations (highlighted with asterisks and bold text) will verify that the digital switches (the LEDs shown in the drawing are for visual indication and are not necessary in the final design).

| SW1 | SW2 | SW3 | LED1 | LED2 |
|---|---|---|---|---|
| Open | Open | Open | Off | Off |
| Closed | Open | Open | Off | Off |
| Open | Closed | Open | Off | Off |
| Closed | Closed | Open | * On * | * On * |
| Open | Open | Closed | Off | Off |
| Closed | Open | Closed | Off | Off |
| Open | Closed | Closed | Off | Off |
| Closed | Closed | Closed | * On * | * On * |

In a second case, an active speed probe condition may be identified. When the speed probe is over a void the voltage is approximately 23 volts. When the speed probe is over metal the voltage is near 0 volts. The highlighted entries in the table below can be used to differentiate the presence of this condition from the "no probe attached condition."

| SW1 | SW2 | SW3 | VOID or METAL | LED1 | LED2 |
|---|---|---|---|---|---|
| Open | Open | Open | Void | Off | Off |
| Closed | Open | Open | Void | Off | Off |
| Open | Closed | Open | Void | Off | * On * (14.6 V on sensor output 23 V with SW2 off) |
| Closed | Closed | Open | Void | On | On |
| Open | Open | Closed | Void | Off | Off |
| Closed | Open | Closed | Void | * On * | Off - this state happens even with the power off |
| Open | Closed | Closed | Void | Off | Off |
| Closed | Closed | Closed | Void | On | On |
| Open | Open | Open | Metal | Off | Off |
| Close | Open | Open | Metal | * On * | Off |
| Open | Closed | Open | Metal | Off | Off |
| Closed | Closed | Open | Metal | On | On |
| Open | Open | Closed | Metal | Off | Off |
| Close | Open | Closed | Metal | * On * | Off |
| Open | Closed | Closed | Metal | Off | Off |
| Closed | Closed | Closed | Metal | On | On |

In a third case, an alternative active speed probe condition may be identified. Some speed probes output 23 volts when the probe is near a metal surface, while others output 0 volts when the probe is near a metal surface. The converse is true when the speed probe is not near a metal surface, or over a void in the speed wheel. When the probe first detects a metal surface it outputs 23 volts, and after a few seconds it drops to approximately 0 volts. The reverse is true when the metal is removed—it starts out close to 0 volts and after a few seconds it goes to 23 volts. The table below shows two separate entries for LEDs "1st" and "late." The "1st" column designates the value observed when the probe first detects a metal surface or a void. The "late" column designates the value observed after the probe has switched to its long term state. Even though the probe switches state, the module can still detect the presence of the probe. The highlighted entries in the table below can be used to differentiate the presence of the condition from the "no probe attached condition."

| SW1 | SW2 | SW3 | VOID or METAL | LED1 1st | LED2 1st | LED1 late | LED2 late |
|---|---|---|---|---|---|---|---|
| Open | Open | Open | Void | Off | Off | Off | Off |
| Closed | Open | Open | Void | * On * | Off | Off | Off |
| Open | Closed | Open | Void | Off | Off | Off | * On * |
| Closed | Closed | Open | Void | On | On | On | On |
| Open | Open | Closed | Void | Off | Off | Off | Off |
| Closed | Open | Closed | Void | * On * even happens with power to probe off | Off | Off | Off |
| Open | Closed | Closed | Void | Off | Off | Off | * On * |
| Closed | Closed | Closed | Void | Off | On | On | On |
| Open | Open | Open | Metal | Off | Off | Off | Off |
| Close | Open | Open | Metal | Off | Off | * On * | Off |
| Open | Closed | Open | Metal | Off | * On * | Off | Off |
| Closed | Closed | Open | Metal | On | On | On | On |
| Open | Open | Closed | Metal | Off | Off | Off | Off |
| Close | Open | Closed | Metal | Off (actually turns on if the power to the probe is off) | Off | * On * | Off |
| Open | Closed | Closed | Metal | Off | * On * | Off | Off |
| Closed | Closed | Closed | Metal | On | On | On | On |

In a fourth case, a passive probe condition may be identified. If there is no movement, the probe outputs close to 0 volts. The highlighted entry in the table below can be used to differentiate the presence of the condition from the "no probe attached condition."

| SW1 | SW2 | SW3 | LED1 | LED2 |
|---|---|---|---|---|
| Open | Open | Open | Off | Off |
| Closed | Open | Open | Off | Off |
| Open | Closed | Open | Off | Off |
| Closed | Closed | Open | On | On |
| Open | Open | Closed | Off | Off |
| Close | Open | Closed | * On * | Off |
| Open | Closed | Closed | Off | Off |
| Closed | Closed | Closed | On | Off |

In a fifth case, a piezoelectric probe condition may be identified. If there is no movement, the probe outputs close to 0 volts. The highlighted entry (single asterisk) in the table below can be used to differentiate the presence of the condition from the "no probe attached condition." The other highlighted entry (double asterisks) can differentiate the presence of the condition from a passive probe.

| SW1 | SW2 | SW3 | LED1 | LED2 | Note |
|---|---|---|---|---|---|
| Open | Open | Open | Off | Off | |
| Closed | Open | Open | ** On ** | Off | |
| Open | Closed | Open | Off | Off | |
| Closed | Closed | Open | On | On | |
| Open | Open | Closed | Off | Off | |
| Close | Open | Closed | * On * | Off | unique |
| Open | Closed | Closed | Off | Off | |
| Closed | Closed | Closed | On | Off | |

In a sixth case, an alternative passive probe condition may be identified. The highlighted entry in the table below can be used to differentiate the presence of the condition from the "no probe attached condition."

| SW1 | SW2 | SW3 | LED1 | LED2 |
|---|---|---|---|---|
| Open | Open | Open | Off | Off |
| Closed | Open | Open | Off | Off |
| Open | Closed | Open | Off | Off |
| Closed | Closed | Open | On | On |
| Open | Open | Closed | Off | Off |
| Close | Open | Closed | * On * | Off |
| Open | Closed | Closed | Off | Off |
| Closed | Closed | Closed | On | On |

In a seventh case, another alternative passive probe condition may be identified. The highlighted entry in the table below can be used to differentiate the presence of the condition from the "no probe attached condition." In this alternative, the wires may be connected either way.

| SW1 | SW2 | SW3 | LED1 | LED2 |
|---|---|---|---|---|
| Open | Open | Open | Off | Off |
| Closed | Open | Open | Off | Off |
| Open | Closed | Open | Off | Off |
| Closed | Closed | Open | On | On |
| Open | Open | Closed | Off | Off |
| Close | Open | Closed | * On * | Off |
| Open | Closed | Closed | Off | Off |
| Closed | Closed | Closed | On | On |

In an eighth case, an active speed probe with no power applied condition may be identified.

| SW1 | SW2 | SW3 | VOID or METAL | LED1 | LED2 |
|---|---|---|---|---|---|
| Open | Open | Open | Void | Off | Off |
| Closed | Open | Open | Void | ** On ** | Off |
| Open | Closed | Open | Void | Off | ** Off ** |
| Closed | Closed | Open | Void | On | On |
| Open | Open | Closed | Void | Off | Off |
| Closed | Open | Closed | Void | * On * | Off |
| Open | Closed | Closed | Void | Off | Off |
| Closed | Closed | Closed | Void | On | On |
| Open | Open | Open | Metal | Off | Off |
| Close | Open | Open | Metal | * On * | Off |
| Open | Closed | Open | Metal | Off | Off |
| Closed | Closed | Open | Metal | On | On |

-continued

| SW1 | SW2 | SW3 | VOID or METAL | LED1 | LED2 |
|---|---|---|---|---|---|
| Open | Open | Closed | Metal | Off | Off |
| Close | Open | Closed | Metal | * On * | Off |
| Open | Closed | Closed | Metal | Off | Off |
| Closed | Closed | Closed | Metal | On | On |

In the case of the active speed probes, there are two different conditions using the same probe without the power wire attached (see the entries highlighted with double asterisks above). These conditions happen when the probe is over a void because when the probe is powered and over a void it outputs 23 volts. When the power is removed, the probe can no longer source 23 volts, so it acts like the condition where the probe is over a metal surface (outputs 0 volts). In this case, it is possible to detect the presence of the probe, but cannot differentiate between a powered probe over a metal surface and an unpowered probe over a void.

In a ninth case, an alternative active speed probe without power condition may be identified. Some speed probes output 23 volts when the probe is near a metal surface, while others output 0 volts when the probe is near a metal surface. The converse is true when the speed probe is not near a metal surface, or over a void in the speed wheel. When the probe first detects a metal surface it outputs 23 volts, and after a few seconds it drops to approximately 0 volts. The reverse is true when the metal is removed—it starts out close to 0 volts and after a few seconds it goes to 23 volts.

In this case, the probe has no power, so it cannot output 23 volts, therefore it cannot change voltage levels as in the case with the active probe with power. The "Void" and "Metal" columns are shown in the table below to compare with previous cases.

The highlighted entries (with single asterisks) in the table below can be used to differentiate the presence of this condition from the "no probe attached condition."

| SW1 | SW2 | SW3 | VOID or METAL | LED1 late | LED2 late |
|---|---|---|---|---|---|
| Open | Open | Open | Void | Off | Off |
| Closed | Open | Open | Void | ** On ** | Off |
| Open | Closed | Open | Void | Off | ** Off ** |
| Closed | Closed | Open | Void | On | On |
| Open | Open | Closed | Void | Off | Off |
| Closed | Open | Closed | Void | ** On ** | Off |
| Open | Closed | Closed | Void | Off | ** Off ** |
| Closed | Closed | Closed | Void | On | On |
| Open | Open | Open | Metal | Off | Off |
| Close | Open | Open | Metal | * On * | Off |
| Open | Closed | Open | Metal | Off | Off |
| Closed | Closed | Open | Metal | On | On |
| Open | Open | Closed | Metal | Off | Off |
| Close | Open | Closed | Metal | * On * | Off |
| Open | Closed | Closed | Metal | Off | Off |
| Closed | Closed | Closed | Metal | On | On |

There are four cases (highlighted with double asterisks) in the chart above that are different from the case of the same probe with power attached. It is impossible to differentiate the case of the active speed probe without power from the case of the active speed probe with power if it is stopped over a metal surface.

With the detection circuit of FIG. 1, six probe variations are possible to detect the presence of each condition. However, it is not possible to detect a break in the power connection to an active probe.

Figure 2:
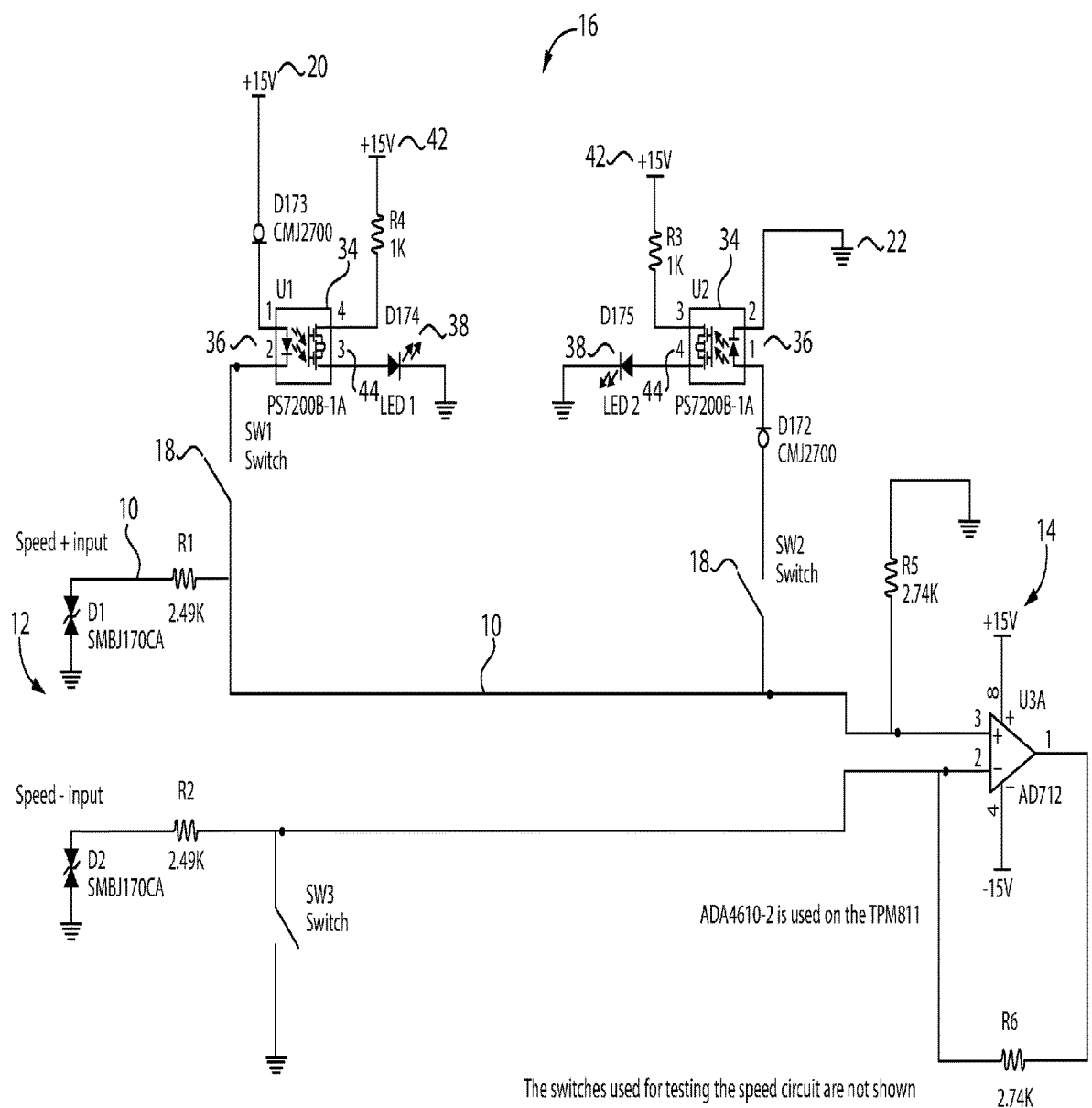
FIG. 2 is a schematic of another embodiment of a speed probe diagnostic circuit.

Another embodiment of a speed probe detection circuit is shown in FIG. 2. In this version of the circuit, the probe detection elements are isolated from the probe during normal operation. It is logically equivalent to the previous version, but simpler. This version includes an op amp to the circuit to determine what will happen if the module can detect the presence of a speed probe without disconnecting the op-amp. An advantage for doing this allows the speed testing circuitry to be placed earlier in the signal path, which allows more circuitry coverage with the probe detection tests.

One disadvantage of the detection circuit of FIG. 2 is that there is always a path to GND even if there is no probe attached.

Figure 3:
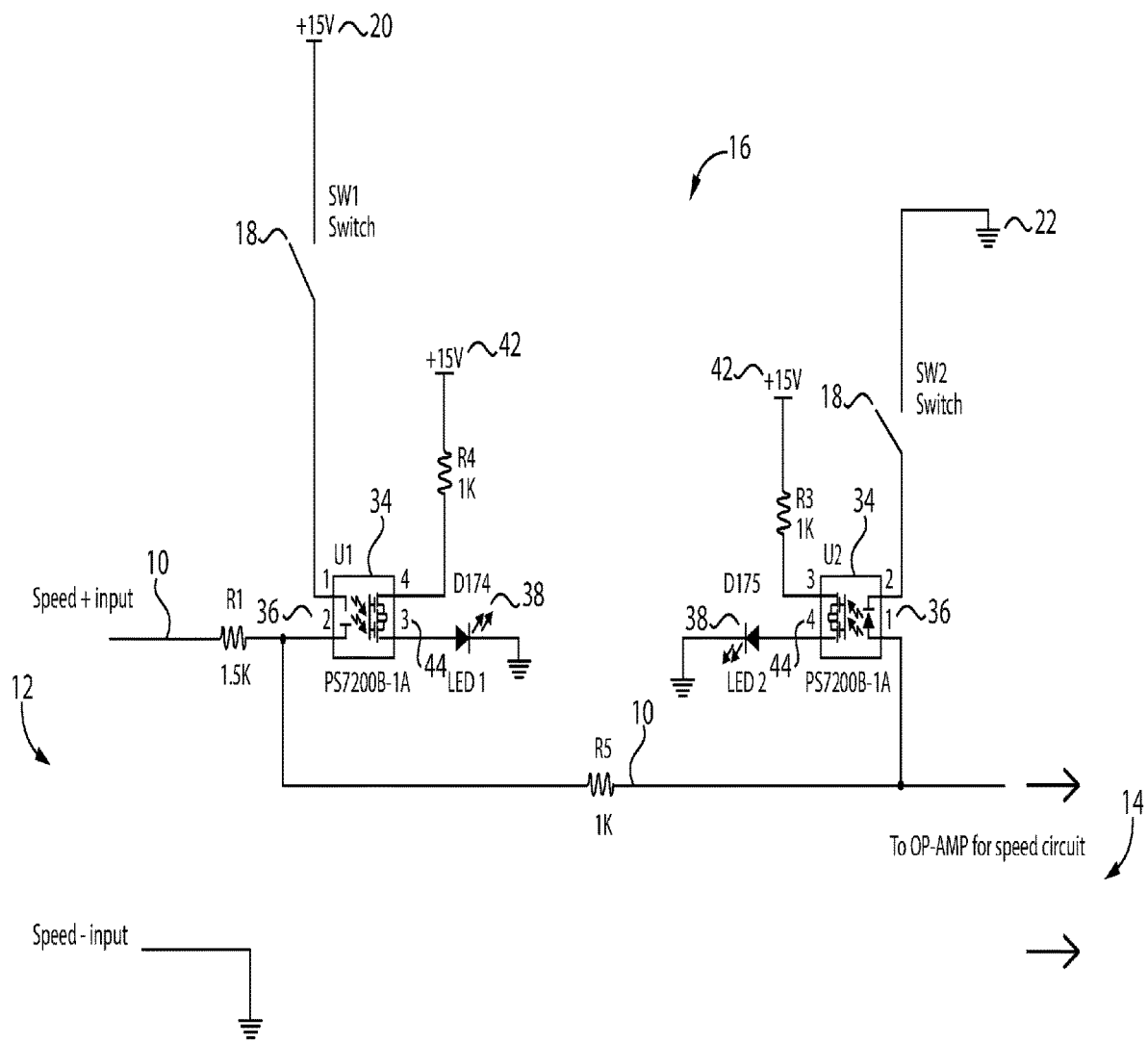
FIG. 3 is a schematic of another embodiment of a speed probe diagnostic circuit.

Another embodiment of a speed probe detection circuit is shown in FIG. 3. This version of the speed probe detection circuit is preferred.

In a first case, a no probe attached condition may be identified.

| SW1 | SW2 | LED1 | LED2 |
|---|---|---|---|
| Open | Open | Off | Off |
| Closed | Open | Off | Off |
| Open | Closed | Off | Off |
| Closed | Closed | On | On |

In a second case, a passive probe condition may be identified.

| SW1 | SW2 | LED1 | LED2 |
|---|---|---|---|
| Open | Open | Off | Off |
| Closed | Open | On | Off |
| Open | Closed | Off | Off |
| Closed | Closed | On | On |

In a third case, an active probe over metal condition may be identified.

| Void = 23 V, Metal = 117 mV | | | |
|---|---|---|---|
| SW1 | SW2 | LED1 | LED2 |
| Open | Open | Off | Off |
| Closed | Open | On | Off |
| Open | Closed | Off | Off |
| Closed | Closed | On | On |

In a fourth case, an active probe over void condition may be identified.

| Void = 23 V, Metal = 117 mV | | | |
|---|---|---|---|
| SW1 | SW2 | LED1 | LED2 |
| Open | Open | Off | Off |
| Closed | Open | Off | Off |
| Open | Closed | Off | On |
| Closed | Closed | On | On |

Version 2 Conclusion

With the detection circuit of FIG. 3, it is possible to determine that a speed probe is attached if the LED lights up when only one of the switches is closed.

Figure 4:
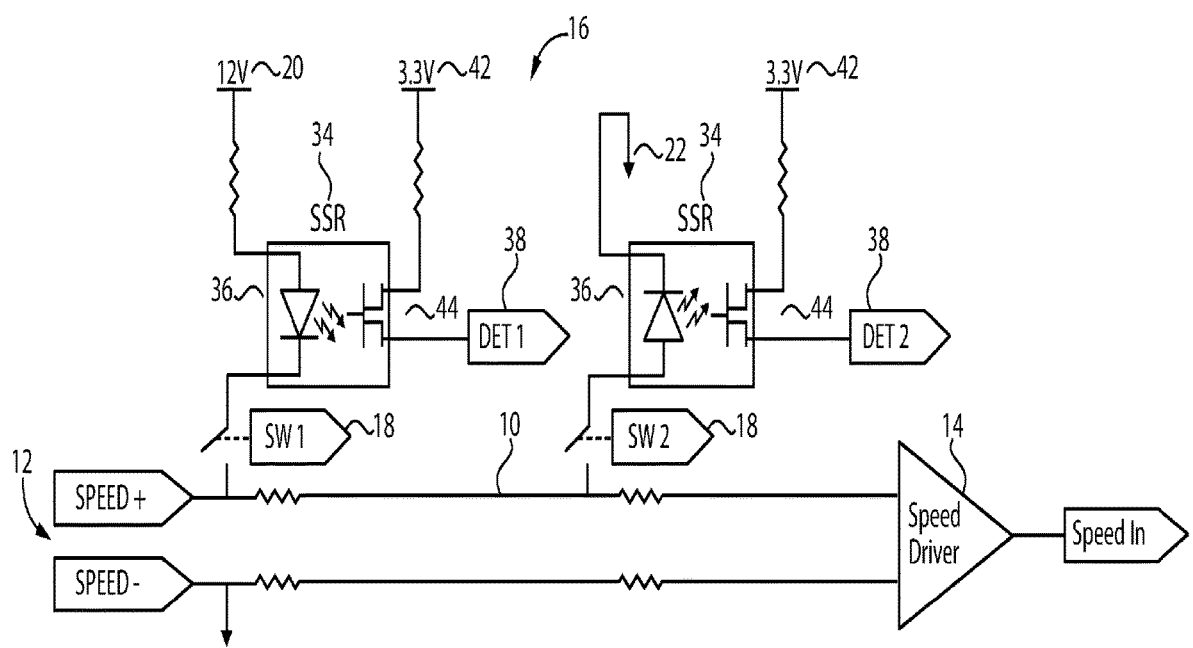
FIG. 4 is a schematic of another embodiment of a speed probe diagnostic circuit.

Note that the actual signal read by the system will be a '0' when the LED is 'ON' and a '1' when the LED is 'OFF.' The reason for this is that when the isolator turns on the LED will light. When the isolator turns on in the system board, the signal will be grounded. The system circuit diagram is shown in FIG. 4.

The principal application and use of the described embodiments includes speed control and overspeed protection primarily in power generating steam turbines. When the module no longer detects a speed signal it needs to determine whether the turbine shaft has stopped spinning or if the speed probe has been disconnected. Additionally, this invention can detect the probe failure for different types of speed probes, such as Active, Passive, or Eddy Current speed probes.

Failing to accurately determine a stopped rotor could cause damage to equipment or injury of personnel ranging anywhere from minor to severe. One condition may engage equipment while the rotor is still moving and another may cause the rotor to overspeed creating a severely dangerous situation.

A problem overcome by the described embodiments involves the fact that when the rotor stops moving the speed signal may output 0 volts or some other voltage that may appear similar to a disconnected probe. Furthermore, different types of speed sensors react differently to loss of speed, so the described embodiments can distinguish a loss of speed among the different types of sensors.

Some prior modules have not accurately determined the difference between loss of the speed probe and a stationary rotor. Other modules may detect the loss of the probe, but only function with a certain type of sensor. The described embodiments not only can detect the loss of the sensor, but does so for a variety of sensors.

An advantage of the described embodiments includes determining if a rotor is moving or stopped. Another advantage is distinguishing the difference among a variety of probes.

When the module no longer detects a speed signal, it needs to determine if the cause of the loss of signal is due to the shaft no longer turning or if the speed sensor failed. The failure could be due to an open circuit or due to a short circuit. To determine the causes of the zero speed, the module activates several solid state relays (SSRs) to inject a voltage into the circuit. When the SSRs activate, a voltage is applied to the circuit that triggers an LED in an optocoupler. Depending on which SSR is set and the status of the optocoupler, the module can determine the status of the speed sensor. Since different sensor types respond differently the design of the circuit allows the module to determine the status of the sensor regardless of the sensor type. The preferred embodiments overcome the problem of determining the cause of a zero speed condition with different types of speed sensors.

In another aspect of the preferred embodiments, the system module is pre-programmed with a variety of advanced detection and protection algorithms, capable of taking immediate action in the case of a dangerous condition. These algorithms are designed to address the protection requirements of most turbine styles and manufacturers. These functions can be individually enabled or disabled for maximum flexibility. The algorithms described below include turbine trip, overspeed protection, acceleration protection, rate-sensitive power load unbalance, close intercept valve, early valve actuation, trip anticipator, load drop anticipator.

The turbine trip algorithm initiates trip relays to close valves when the turbine rotational speed exceeds a setpoint, typically 110% of rated speed. The purpose is to trip (shutdown) the machine before reaching dangerous speeds. The TRIP action is considered a "turbine trip," in that it trips the mechanical trip system, causing the turbine to be no longer "reset." Once set, the TRIP output remains ON until the turbine speed is reduced to a percentage of the trip setpoint, configured by the OSP Hysteresis parameter. In addition to the overspeed trip, the system module has five digital inputs which can be configured as trip switch inputs to activate the Trip function. The trip switches can be configured to only initiate a trip when operating above a user defined speed.

Figures 5, 6, 7, 8:
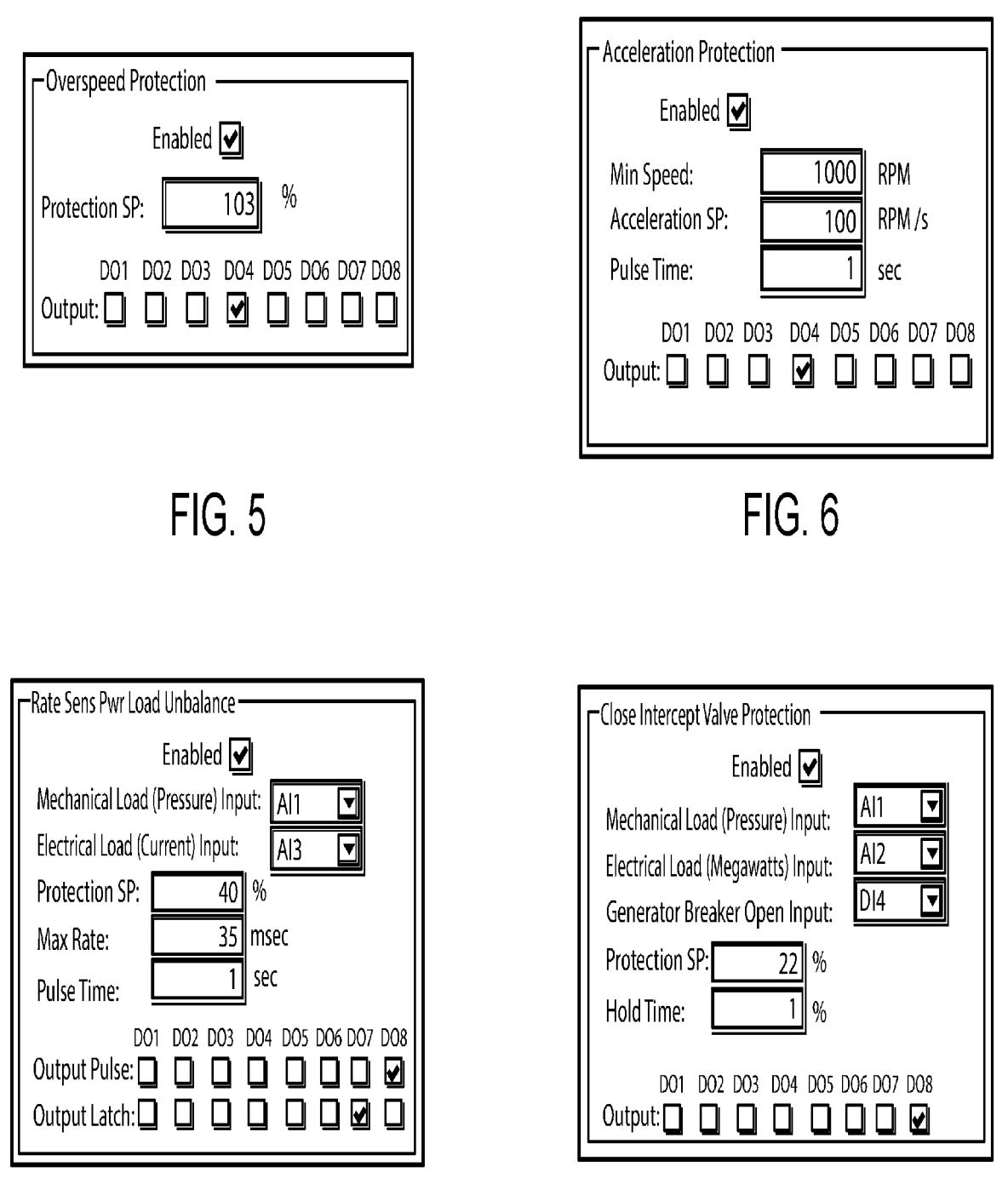

The overspeed protection (OSP) algorithm initiates relays to close valves when the turbine rotational speed exceeds a setpoint, typically 103% of rated speed. The purpose is to gain control of the turbine before it reaches the trip setpoint. To activate overspeed protection the system compares the following values: the speed input readings and the turbine rated-speed parameter. Whenever the speed exceeds the activation level (typically 103%) the intercept values (IV) and control valves (CV) will be closed until the turbine speed is reduced to a percentage of the overspeed setpoint, configured by the OSP Hysteresis parameter. The activation state can be configured to either energized or de-energized outputs. A configuration window for overspeed protection is shown in FIG. 5.

The acceleration protection algorithm calculates the rotational acceleration of the turbine and initiates relays to attempt to gain control of the turbine before it reaches an overspeed condition. To activate acceleration protection, the system compares the following values: the speed input readings, the acceleration speed threshold parameter, the speed input acceleration readings, and the acceleration setpoint parameter. Whenever the turbine speed exceeds the acceleration speed threshold, and the acceleration value exceeds the acceleration setpoint, the IVs and CVs will close until acceleration falls below the setpoint and the minimum pulse duration has been reached. The activation state can be configured to result in either energized or de-energized outputs. A configuration window for acceleration protection is shown in FIG. 6.

The rate-sensitive power load unbalance protection function activates the fast-closing of the control and intercept valves during a load rejection. The algorithm compares the mechanical and electrical load by subtracting the % generator current value from the % cold reheat pressure value. The output is activated when the following two conditions occur: the difference between these values exceeds a specific setpoint (typically 40%), and the generator current decreases at a rate of rated Load/35 msec (this value is adjustable). Current is used instead of power to differentiate between a load-loss and a stable self-clearing fault. This means that it will not activate on a fault condition. The rate-sensitive power load unbalance function generates two outputs: the first output is a pulse intended to close the intercept valves for 1 second (this value is adjustable), and the second output is latched-in until the difference between mechanical and electrical load clears the activation setpoint. The latched output is intended to close the control valves. The activation state can be configured to either energized or de-energized outputs. A configuration window for rate-sensitive power load unbalance protection is shown in FIG. 7.

The close intercept valve function detects partial loss-of-load by comparing mechanical and electrical load. This value is calculated by subtracting the percent of rated generator megawatts from the percent of rated intermediate exhaust pressure (IP). The output is activated whenever the difference exceeds a specific setpoint (typically 40%). The function causes the closing of the intercept valves for one second (this value is adjustable). The protection function is re-activated only when the two power signals (mechanical and electrical) are within 10% of each other for a specific time period. The activation state can be configured to either energized or de-energized outputs. A configuration window for close intercept valve protection is shown in FIG. 8.

The early valve actuation function is activated upon detection of an electrical system fault. It reduces the mechanical power to prevent loss of synchronization due to an excessive machine angle. The algorithm compares mechanical and electrical load by subtracting the percent of rated generator megawatts value from the percent of rated cold reheat pressure value. The output is activated when the following two conditions occur: the difference in the two values exceeds the generator worst-fault capability level without synchronization loss (the default value is 70%), and the generator megawatts also decreases at a rate of Rated Load/100 msec (this value is adjustable). The pulse output of this function is intended to close the intercept valves for one second (this value is adjustable). The activation state can be configured to either energized or de-energized outputs. A configuration window for early valve actuation is shown in FIG. 9.

The trip anticipator function is only applicable to large turbines where peak speeds during loss-of-load conditions can exceed 120% of the rated speed. The trip anticipator algorithm compares the turbine speed to a load-dependent reference signal. Whenever this reference is exceeded, the trip anticipator is activated, causing momentary closing of the MSVs and RHSVs. The activation state can be configured to either energized or de-energized outputs. A configuration window for trip anticipator is shown in FIG. 10.

To determine a load drop anticipator (LDA) condition, the system monitors the mechanical load of the turbine and the generator breaker status. If the mechanical load is above a minimum load setpoint (the default value is 30%) and the generator breaker opens, a condition exists that will likely cause the turbine to overspeed. As a result, the LDA protection will be activated to close the control and intercept valves. The function will reset five seconds after the breaker opens, as long as the turbine speed is below 103% of rated speed. The activation state can be configured to either energized or de-energized outputs. A configuration window for load drop anticipation is shown in FIG. 11.

It is noted that initiating relays may involve energizing or de-energizing the relays depending on their normal operating state.

The principal applications for the preferred embodiments are generally large steam turbines at electrical power plants. Each turbine manufacturer has a different method of protecting the turbine for overspeed protection and other types of faults. Additionally, they often require a different set of sensor inputs used to determine a potential dangerous situation along with different outputs used for protection of the machine. Moreover, other smaller machines that require safety measures may use this device for protection against dangerous conditions.

A problem overcome by the preferred embodiments is to provide a single device that the user can use to configure the protection system for their equipment. Previous devices were limited to specific turbine types or specific applications. This would require the user to order specific protection devices that may not be available with a particular system. Furthermore, it would limit the flexibility to provide additional or alternate protection methods.

As shown and described, different protection requirements and controls for different turbines may be satisfied in a single tool by allowing parameters of each function to be adjusted. Also, where different turbines require entirely different algorithms or other control arrangements, the enable/disable option may be used to select which functions to use for a particular turbine.

Advantages of the preferred embodiments include: using a single device for any turbine system, flexible configuration, SIL-3 certified by TÜV, providing a variety of input sensor devices, and providing a variety of output options.

The preferred device has all of the protection algorithms built-in to the module, so they are always available for any system. Each protection method has a list of parameters used to configure the system. Additionally, each method has an enable/disable option allowing the user to permit or inhibit the function under certain conditions. Furthermore, the user may select different output relay options that may activate or deactivate protection devices that either recover from a dangerous situation or shutdown the equipment completely.

Referring again to the speed probe detection (or diagnostic) circuit, and particularly to FIGS. 12-16, in normal operation the speed reading circuitry will take the AC signal from the speed probe and provide the frequency. When there is an AC signal coming from the speed probe it is recognized that the probe is working. The problem exists when there is no signal coming from the speed probe. It is then necessary to determine if the speed probe has been disconnected/shorted or if the speed is actually zero.

The speed probe detection circuitry uses FETs (i.e., solid state relays (SSR)) to isolate the speed reading circuitry from the field (i.e., the speed probe) and then injects voltages to the speed probe terminals in the field. The detection circuitry and the firmware work hand in hand to detect the presence or absence of a speed probe.

Speed probes can be divided into two classes, active and passive. A passive speed probe will be seen as a resistance when a voltage is applied. If a voltage is applied to a passive probe there should be a current flow. This current flow may be used to turn on a result FET.

An active probe will drive either a "high" voltage (usually around 22 to 24V) or a "low" voltage (usually less than 1V). FETs may be used to inject a voltage into the speed probe terminals and read back a result based on the presence or absence of current flow in the result FETs.

Figure 12:
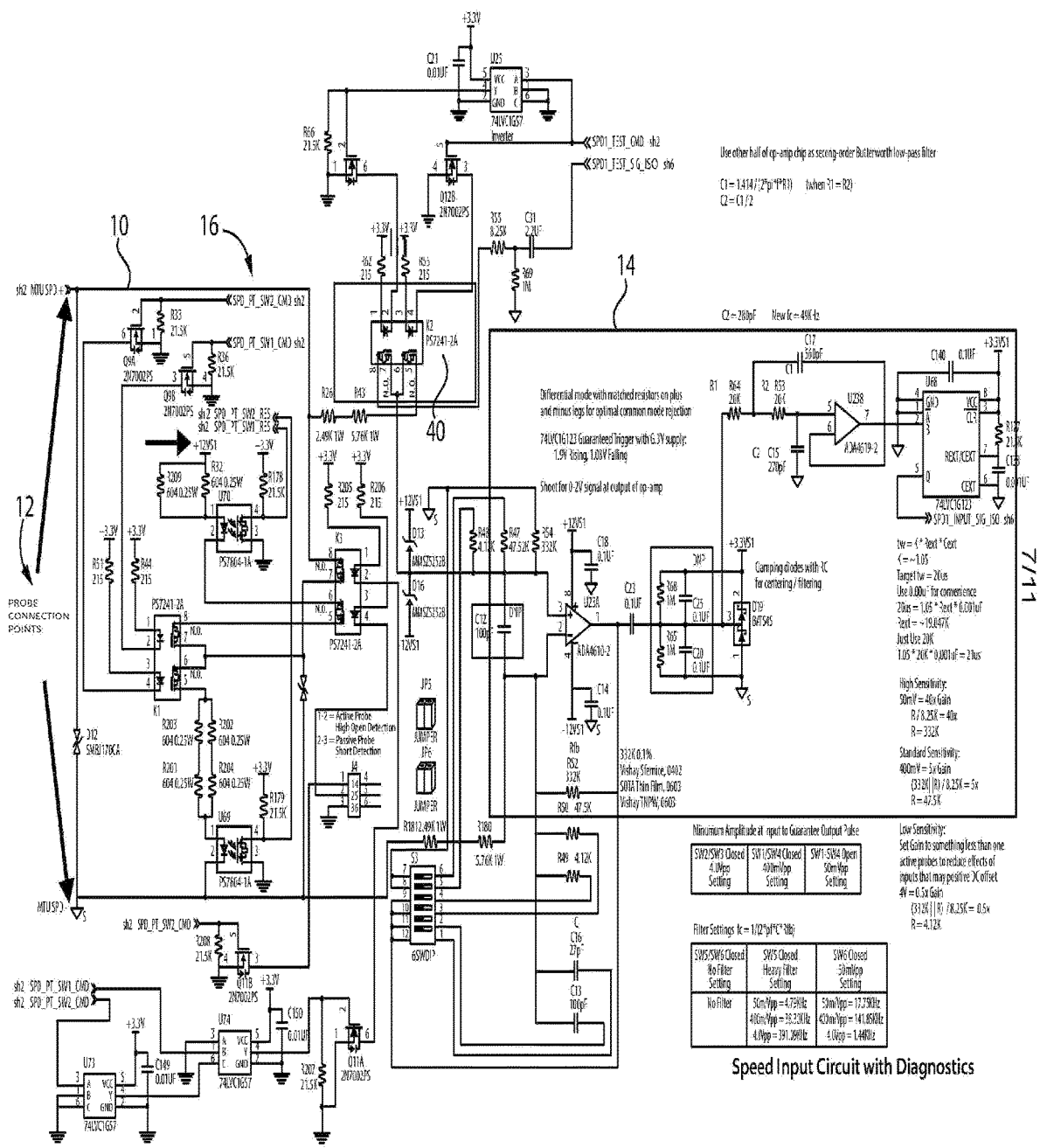
FIG. 12 is a schematic of an embodiment of a speed probe diagnostic circuit and a speed reading circuit.
Figure 13:
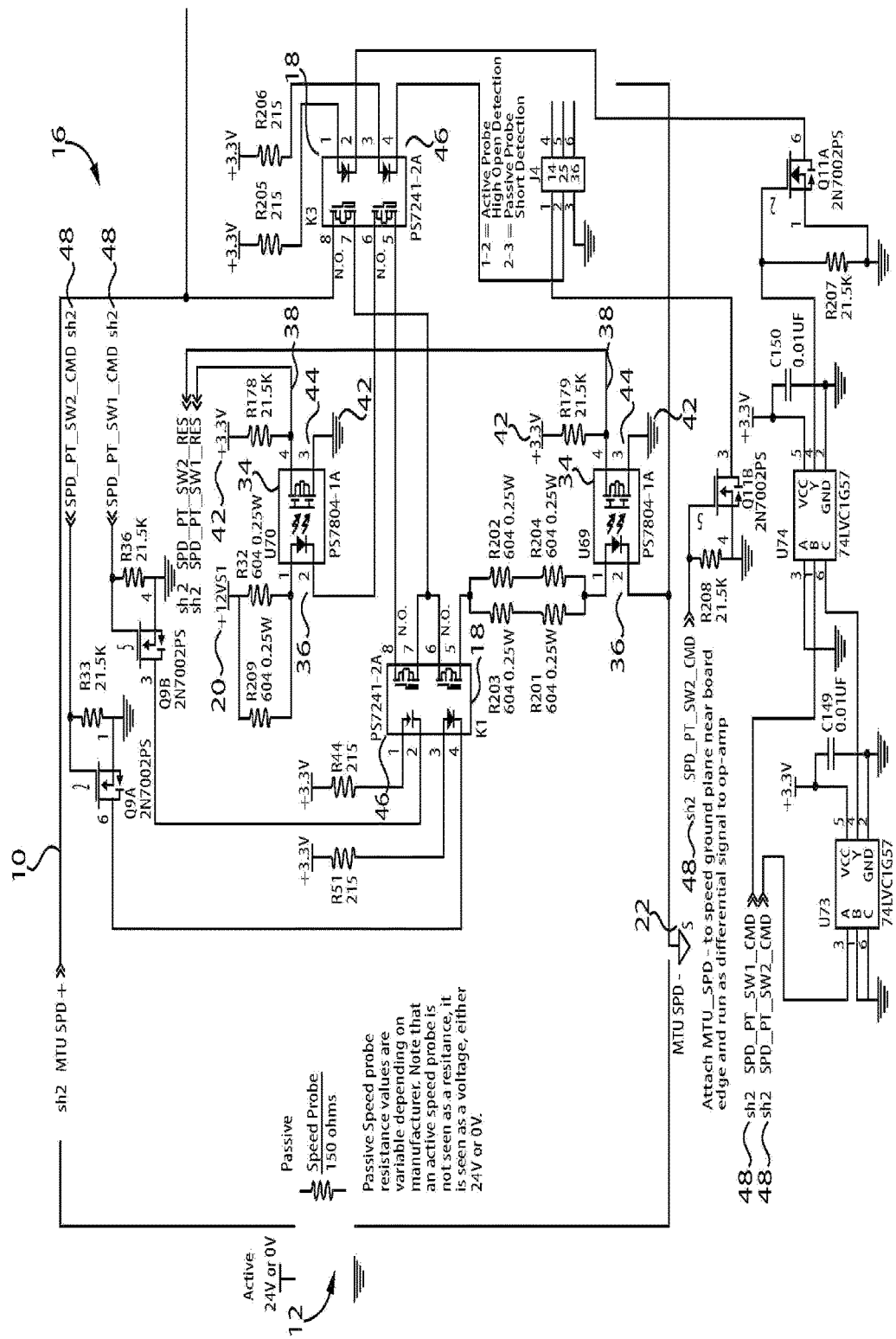
FIG. 13 is a schematic of the speed probe diagnostic circuit of FIG. 12.

As shown in FIG. 12, the speed probe detection circuit may be part of the larger speed circuit. To more easily understand the speed probe detection, the speed reading circuit (which is electrically isolated during the speed probe detection process) and the transient voltage suppressors are removed from FIGS. 13-16. Thus, an embodiment of the speed probe detection (or diagnostic) circuit is shown in FIG. 13. The speed probe is shown on the left as either a resistor or a voltage (0 or 24V).

Figure 14:
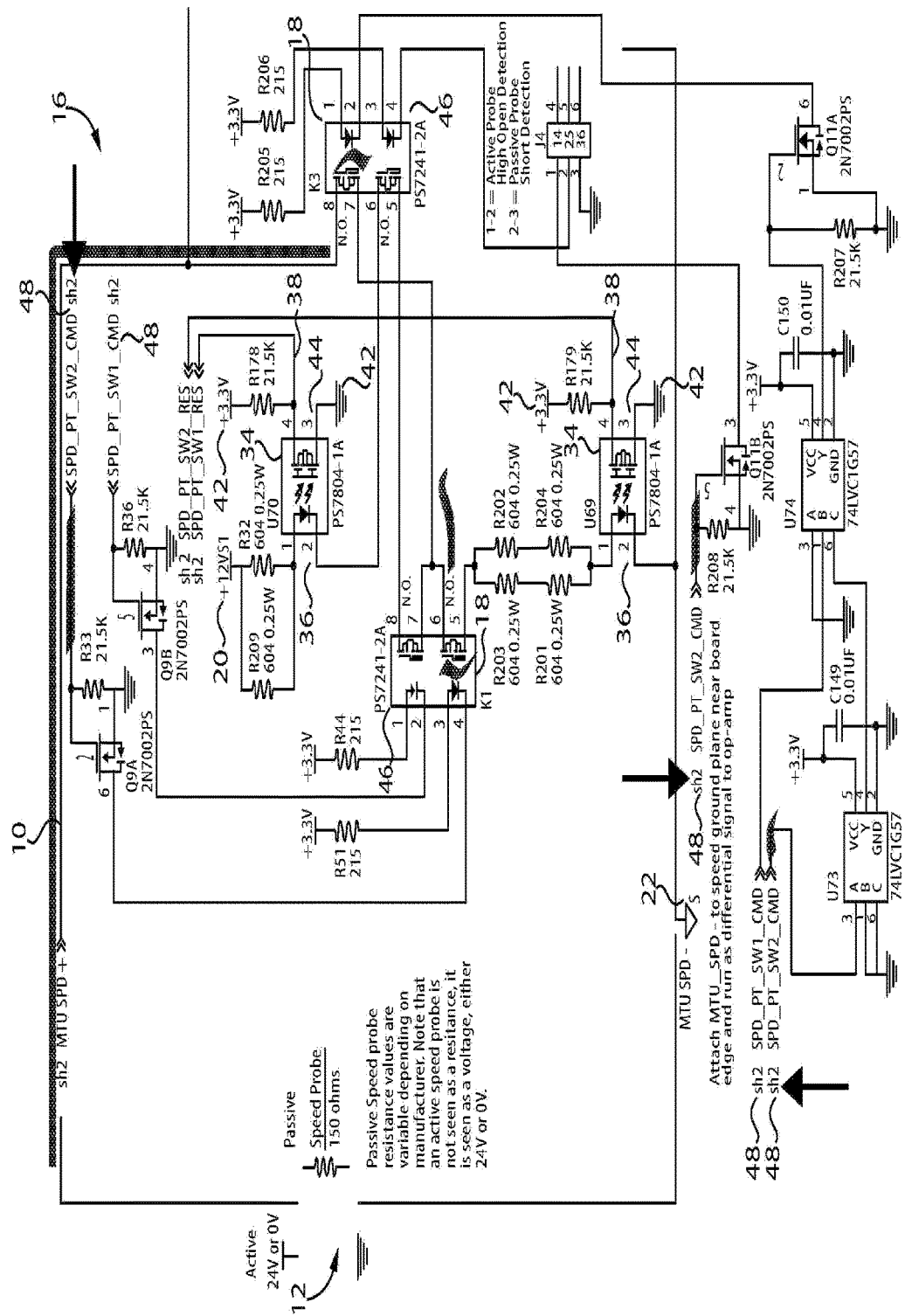
FIG. 14 is the schematic of the speed probe diagnostic circuit of FIG. 13 showing a first step of a test.

In step 1 of the test, SPD_PT_SW2_CMD is set to a "1" and SPD_PT_SW1_CMD is set to a "0". This is designed to detect an active speed probe that is outputting 24V. K3 pins 7 and 8 are connected and K1 pins 5 and 6 are connected. Note that J4 should also have pins 1-2 connected if an active probe is used in the circuit. This is illustrated in FIG. 14.

If the readback of signal SPD_PT_SW2_RES is a "0", that means that 24V has been detected on MTU_SPD+. The speed probe detection test is then finished at this point. That is, in this case, 24V is present on MTU_SPD+, which goes through K3 pins 8 and 7, then on to K1 pins 6 and 5. If there is a voltage, 24V goes through the resistor network (designed to limit current through the diode on U69). If there is a voltage, the diode on U69 will turn on and drive the SPD_PT_SW2_RES to "0". If there is no voltage, the diagnostic tests progress to step 2.

The results of step 2 and step 3 are taken together to determine the results of the speed probe detection test. Note that only SPD_PT_SW1_RES is kept for further usage in step 3.

Figure 15:
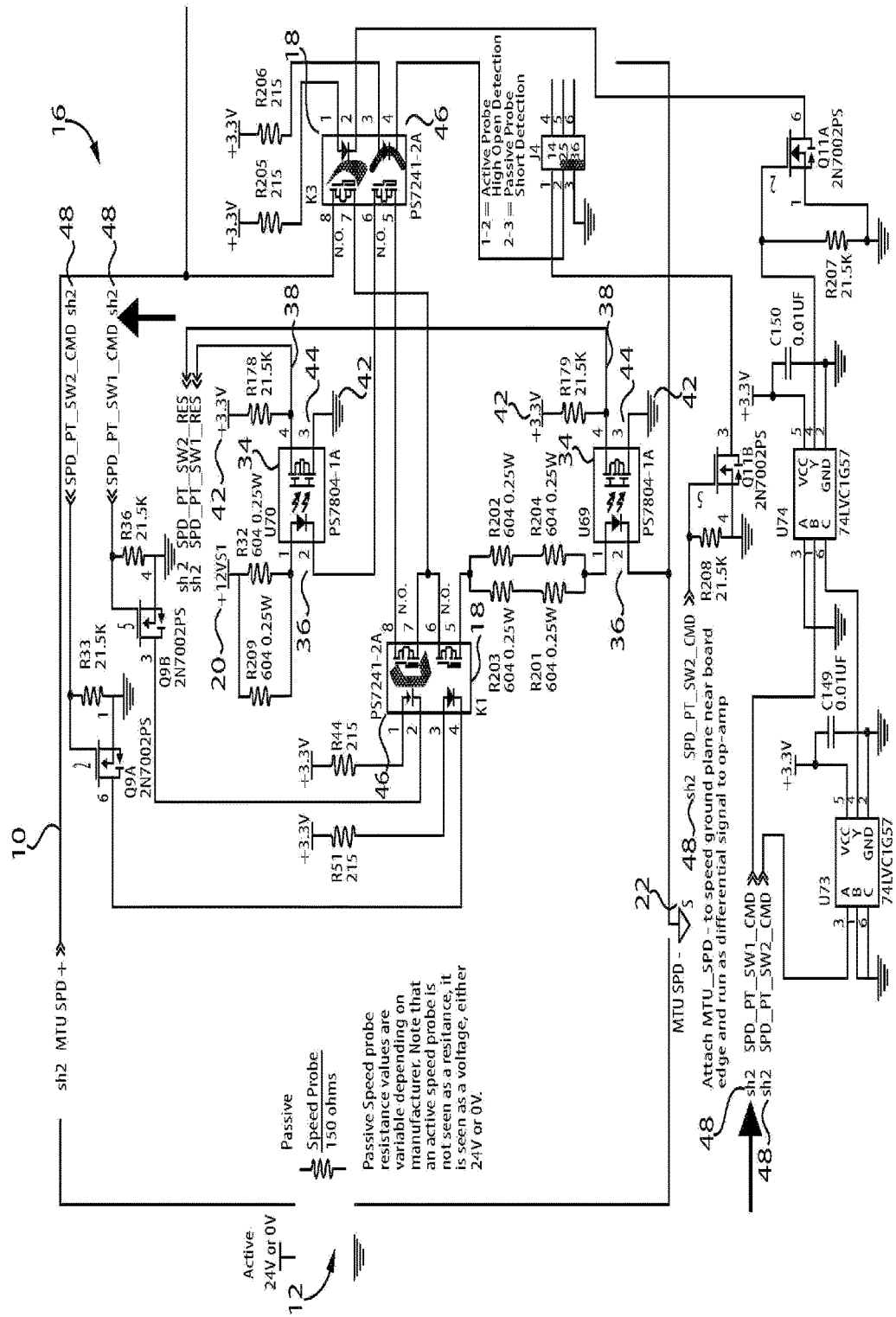
FIG. 15 is the schematic of the speed probe diagnostic circuit of FIG. 13 showing a second step of the test.

In step 2 of the test, SPD_PT_SW2_CMD is set to a "0" and SPD_PT_SW1_CMD is set to a "1". This connects the speed probe MTU_SPD+ through K3 pins 8 and 7. Note that if there is a passive probe attached, J4 pins 2-3 are connected, which will connect K3 pins 6 and 5. If K3 pins 6 and 5 are connected, then U70 pin 2 is connected to MTU SPD+. If U70 pin 2 is less than 12V, then SPD_PT_SW1_RES will be driven to a "0", otherwise it will be a "1". If J4 is set for an active probe, then K3 pins 6 and 5 are open (because SPD_PT_SW2_CMD=0, which in turn means that J4 pin 1 is floating). This is illustrated in FIG. 15.

Figure 16:
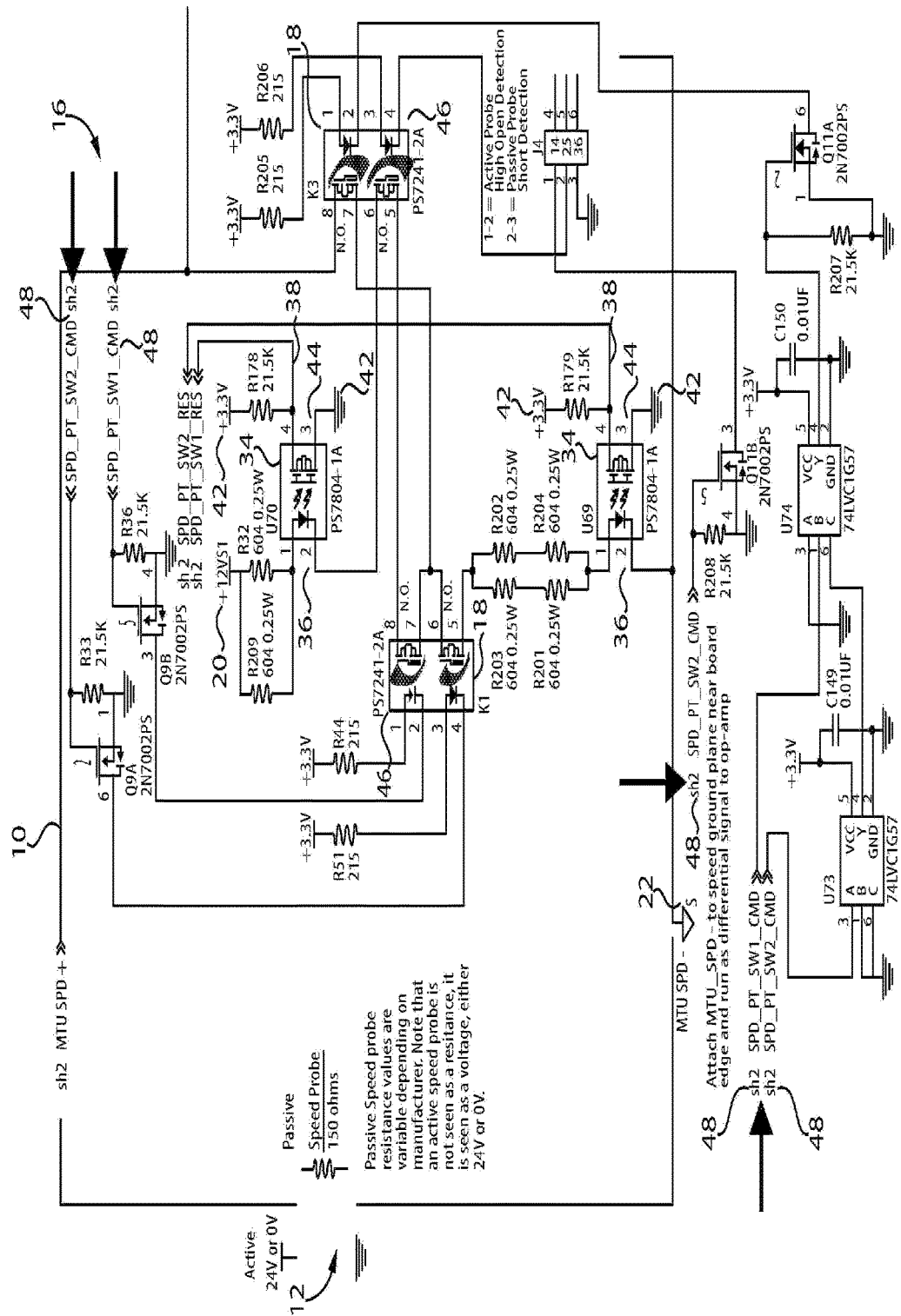
FIG. 16 is the schematic of the speed probe diagnostic circuit of FIG. 13 showing a third step of the test.

In step 3 of the test, SPD_PT_SW2_CMD is set to a "1" and SPD_PT_SW1_CMD is set to a "1". This results in K3 pins 8 and 7 connected (MTU SPD+), which is connected to K1 pins 6 and 5. Also, K3 pins 6 and 5 (U70 pin 2) is now connected to MTU SPD+ through K1 8 and 7. This is illustrated in FIG. 16.

The results of step 2 and step 3 may now be combined. SW1_RES and SW2_RES are the results from step 3, while Step 2 SW1_RES is the result from step 2.

|         |         | Step 2   |                          |
| SW1_RES | SW2_RES | SW1_RES  | Speed Probe              |
|---------|---------|----------|--------------------------|
| 0       | 0       | 0        | Passive Probe (26)       |
| 0       | 0       | 1        | FAIL - open circuit (28, 30) |
| 0       | 1       | 0        | FAIL - short (28, 32)    |
| 0       | 1       | 1        | Active Probe (low signal) (24) |
| 1       | 0       | x        | FAIL - other (28)        |
| 1       | 1       | x        | Active Probe (low signal) (24) |

In the passive probe condition (26), in step 2, the 12V on U70 is connected via K3 pins 6 and 5 to K1 pins 8 and 7, back to K3 pins 7 and 8. Thus, there is a passive probe (i.e., some resistance greater than 0 ohms), so there will be current flow and SPD_PT_SW1_RES will be a 0. In step 3, both switches are on and there is current flowing through the speed probe and some through the resistor network connected to U69 pin 2. Both U69 and U70 opto-couplers are turned on, resulting in SW1_RES and SW2_RES being "0".

In the open circuit condition (28, 30), in step 2, the 12V from U70 is connected to the MTU SPD+ signal, but no current flows through, resulting in SW1_RES="1". This could be the sign of an open. In step 3, both switches are on and current flows through the diodes in U69 and U70, but since no current flowed through MTU SPD+ in step 2, it is all flowing through the resistor network connected to U69, resulting in SW1_RES=SW2_RES="0".

In the short circuit condition (28, 32), in step 2, there is current flowing through the diode in U70 when it is attached to MTU SPD+. Then, in step 3, there is current flowing through U70, but none through U69.

In the active probe (low signal—case 1) condition (24), in step 2, there is no current flowing through U70, because K3 pins 6 and 5 are open. In step 3, there is current flowing through U70 (SW1_RES="0"), and none flowing through U69. This means the 12V has a path through a low voltage on the active probe.

In the fail other condition (28), in step 3, there is no current flowing through U70 (SW1_RES="1"), but there is current flowing through U69 (SW2_RES="0").

In the active probe (low signal—case 2) condition (24), in step 3, there is not enough current flowing through either U69 or U70 to turn on the opto-couplers. This would happen in the case where the active probe is outputting a low signal, but it is higher than 0V and there isn't enough voltage drop across the resistor networks to turn on the opto-couplers.

The inventions as described herein may have one or more of the following features in addition to any of the features described above. Referring to the figures, the following features are shown.

A turbine speed probe diagnostic system including a speed lead 10 connected to a speed probe 12 and to a speed reading circuit 14; a speed probe diagnostic circuit 16; a first isolation switch 18 connected between the speed lead 10 and the speed probe diagnostic circuit 16; wherein the speed probe 12 generates a speed signal and transmits the speed signal through the speed lead 10 to the speed reading circuit 14 during normal operation of the turbine, the first isolation switch 18 being open during normal operation to isolate the speed probe diagnostic circuit 16 from the speed lead 10; and wherein the first isolation switch 18 closes when no speed signal is sensed by the speed reading circuit 14 and the speed probe diagnostic circuit 16 applies a voltage 20 or a ground 22 to the speed lead 10 through the first isolation switch 18 to test for a condition of the speed probe 12 or the speed lead 10.

The turbine speed probe diagnostic system wherein the condition comprises testing whether an active speed probe is outputting a high voltage signal (22).

The turbine speed probe diagnostic system wherein the condition comprises testing whether an active speed probe is outputting a low voltage signal (24).

The turbine speed probe diagnostic system wherein the condition comprises testing whether a passive probe is connected (26).

The turbine speed probe diagnostic system wherein the condition comprises testing whether there is a failure in the speed line or the speed probe (28).

The turbine speed probe diagnostic system wherein the condition comprises testing whether there is an open circuit in the speed line or the speed probe (30).

The turbine speed probe diagnostic system wherein the condition comprises testing whether there is a short circuit in the speed line or the speed probe (32).

The turbine speed probe diagnostic system further comprising a diagnostic switch 34 in the speed probe diagnostic circuit 16, the speed lead 10 and the applied voltage 20 or ground 22 being connected to a pair of control inputs 36 of the diagnostic switch 34, wherein an output 38 of the diagnostic switch 34 identifies the condition.

The turbine speed probe diagnostic system wherein the diagnostic switch 34 is a solid state relay 34.

The turbine speed probe diagnostic system further comprising two of the diagnostic switch 34, wherein the speed lead 10 is connected to one of the pair of control inputs 36 of one diagnostic switch 34 at a different time than the speed lead 10 is connected to one of the pair of control inputs 36 of another diagnostic switch 34, the outputs 38 of the two diagnostic switches 34 being compared to identify the condition.

The turbine speed probe diagnostic system further comprising a configuration switch 46 in the speed probe diagnostic circuit 16, the configuration switch 46 connecting the speed lead 10 to the one diagnostic switch 34 and alternately connecting the speed lead 10 to the another diagnostic switch 34.

The turbine speed probe diagnostic system wherein the configuration switch 46 is a solid state relay 46.

The turbine speed probe diagnostic system further comprising a binary test command 48 connected to a control input of the configuration switch 46.

The turbine speed probe diagnostic system wherein a different voltage 20 or ground 22 is connected to the pair of control inputs 36 of the one diagnostic switch 34 than to the pair of control inputs 36 of the another diagnostic switch 34.

The turbine speed probe diagnostic system further comprising two of the first isolation switch 18, wherein the speed probe diagnostic circuit 16 applies a voltage 20 to the speed lead 10 through one of the first isolation switches 18 and applies a ground 22 through another of the first isolation switches 18 at different times to test the speed probe 12 or the speed lead 10.

The turbine speed probe diagnostic system wherein the first isolation switch 18 is a solid state relay 18.

The turbine speed probe diagnostic system further comprising a second isolation switch 40 connected between the speed probe diagnostic circuit 16 and the speed reading circuit 14, wherein the second isolation switch 40 opens to isolate the speed reading circuit 14 when the speed probe diagnostic circuit 16 tests the speed probe 12 or the speed lead 10.

The turbine speed probe diagnostic system further comprising a binary test command 48 connected to a control input of the first isolation switch 18.

The turbine speed probe diagnostic system further comprising two of the first isolation switch 18; further comprising a diagnostic switch 34 in the speed probe diagnostic circuit 16, the speed lead 10 and the applied voltage 20 or ground 22 being connected to a pair of control inputs 36 of the diagnostic switch 34, wherein an output 38 of the diagnostic switch 34 identifies the condition; further comprising two of the diagnostic switch 34, wherein the speed lead 10 is connected to one of the pair of control inputs 36 of one diagnostic switch 34 at a different time than the speed lead 10 is connected to one of the pair of control inputs 36 of another diagnostic switch 34, the outputs 38 of the two diagnostic switches 34 being compared to identify the condition; wherein the two of the diagnostic switch 34 being a first solid state relay 34 and a second solid state relay 34; wherein a first voltage 20, one of the two of the first isolation switch 18, and the speed lead 10 are connected to the pair of control inputs 36 of the first solid state relay 34, and a second voltage 42 and a first detector 38 are connected to a pair of outputs 44 of the first solid state relay 34; and wherein a ground 22, another of the two of the first isolation switch 18, and the speed lead 10 are connected to the pair of control inputs 36 of the second solid state relay 34, and a third voltage 42 and a second detector 38 are connected to a pair of outputs 44 of the second solid state relay 34.

It is understood that the preferred embodiments described herein may be implemented as computerized methods in a non-transitory computer readable medium if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A turbine speed probe diagnostic system, comprising:
a speed lead connected to a speed probe and to a speed reading circuit;
a speed probe diagnostic circuit;
a first isolation switch connected between the speed lead and the speed probe diagnostic circuit;
wherein the speed probe generates a speed signal and transmits the speed signal through the speed lead to the speed reading circuit during normal operation of the turbine, the first isolation switch being open during normal operation to isolate the speed probe diagnostic circuit from the speed lead; and
wherein the first isolation switch closes when no speed signal is sensed by the speed reading circuit and the speed probe diagnostic circuit applies a voltage or a ground to the speed lead through the first isolation switch to test for a condition of the speed probe or the speed lead.

2. The turbine speed probe diagnostic system according to claim 1, wherein the condition comprises testing whether an active speed probe is outputting a high voltage signal.

3. The turbine speed probe diagnostic system according to claim 1, wherein the condition comprises testing whether an active speed probe is outputting a low voltage signal.

4. The turbine speed probe diagnostic system according to claim 1, wherein the condition comprises testing whether a passive probe is connected.

5. The turbine speed probe diagnostic system according to claim 1, wherein the condition comprises testing whether there is a failure in the speed line or the speed probe.

6. The turbine speed probe diagnostic system according to claim 1, wherein the condition comprises testing whether there is an open circuit in the speed line or the speed probe.

7. The turbine speed probe diagnostic system according to claim 1, wherein the condition comprises testing whether there is a short circuit in the speed line or the speed probe.

8. The turbine speed probe diagnostic system according to claim 1, further comprising a diagnostic switch in the speed probe diagnostic circuit, the speed lead and the applied voltage or ground being connected to a pair of control inputs of the diagnostic switch, wherein an output of the diagnostic switch identifies the condition.

9. The turbine speed probe diagnostic system according to claim 8, wherein the diagnostic switch is a solid state relay.

10. The turbine speed probe diagnostic system according to claim 8, further comprising two of the diagnostic switch, wherein the speed lead is connected to one of the pair of control inputs of one diagnostic switch at a different time than the speed lead is connected to one of the pair of control inputs of another diagnostic switch, the outputs of the two diagnostic switches being compared to identify the condition.

11. The turbine speed probe diagnostic system according to claim 10, further comprising a configuration switch in the speed probe diagnostic circuit, the configuration switch connecting the speed lead to the one diagnostic switch and alternately connecting the speed lead to the another diagnostic switch.

12. The turbine speed probe diagnostic system according to claim 11, wherein the configuration switch is a solid state relay.

13. The turbine speed probe diagnostic system according to claim 11, further comprising a binary test command connected to a control input of the configuration switch.

14. The turbine speed probe diagnostic system according to claim 10, wherein a different voltage or ground is connected to the pair of control inputs of the one diagnostic switch than to the pair of control inputs of the another diagnostic switch.

15. The turbine speed probe diagnostic system according to claim 1, further comprising two of the first isolation switch, wherein the speed probe diagnostic circuit applies a voltage to the speed lead through one of the first isolation switches and applies a ground through another of the first isolation switches at different times to test the speed probe or the speed lead.

16. The turbine speed probe diagnostic system according to claim 1, wherein the first isolation switch is a solid state relay.

17. The turbine speed probe diagnostic system according to claim 1, further comprising a second isolation switch connected between the speed probe diagnostic circuit and the speed reading circuit, wherein the second isolation switch opens to isolate the speed reading circuit when the speed probe diagnostic circuit tests the speed probe or the speed lead.

18. The turbine speed probe diagnostic system according to claim 1, further comprising a binary test command connected to a control input of the first isolation switch.

19. The turbine speed probe diagnostic system according to claim 1,
further comprising two of the first isolation switch;
further comprising a diagnostic switch in the speed probe diagnostic circuit, the speed lead and the applied voltage or ground being connected to a pair of control inputs of the diagnostic switch, wherein an output of the diagnostic switch identifies the condition;
further comprising two of the diagnostic switch, wherein the speed lead is connected to one of the pair of control inputs of one diagnostic switch at a different time than the speed lead is connected to one of the pair of control inputs of another diagnostic switch, the outputs of the two diagnostic switches being compared to identify the condition;
wherein the two of the diagnostic switch being a first solid state relay and a second solid state relay;
wherein a first voltage, one of the two of the first isolation switch, and the speed lead are connected to the pair of control inputs of the first solid state relay, and a second voltage and a first detector are connected to a pair of outputs of the first solid state relay; and
wherein a ground, another of the two of the first isolation switch, and the speed lead are connected to the pair of control inputs of the second solid state relay, and a third voltage and a second detector are connected to a pair of outputs of the second solid state relay.

20. The turbine speed probe diagnostic system according to claim 1, further comprising a diagnostic switch in the speed probe diagnostic circuit, the speed lead and the applied voltage or ground being connected to a pair of control inputs of the diagnostic switch, wherein an output of the diagnostic switch identifies the condition, further comprising two of the diagnostic switch, wherein the speed lead is connected to one of the pair of control inputs of one diagnostic switch at a different time than the speed lead is connected to one of the pair of control inputs of another diagnostic switch, the outputs of the two diagnostic switches being compared to identify the condition, wherein the two of the diagnostic switch are solid state relays, further comprising a configuration switch in the speed probe diagnostic circuit, the configuration switch connecting the speed lead to the one diagnostic switch and alternately connecting the speed lead to the another diagnostic switch, wherein the configuration switch is a solid state relay, further comprising two binary test commands, one of the two binary test commands being connected to a control input of the first isolation switch, and another of the two binary test commands being connected to a control input of the configuration switch.

* * * * *